United States Patent [19]

Yokoyama et al.

[11] Patent Number: 4,998,157

[45] Date of Patent: Mar. 5, 1991

[54] OHMIC CONTACT TO SILICON SUBSTRATE

[75] Inventors: Kenji Yokoyama; Juri Kato; Masashi Ogita, all of Nagano, Japan

[73] Assignee: Seiko Epson Corporation, Tokyo, Japan

[21] Appl. No.: 387,834

[22] Filed: Aug. 1, 1989

[30] Foreign Application Priority Data

| Aug. 6, 1988 | [JP] | Japan | 63-196494 |
| Aug. 6, 1988 | [JP] | Japan | 63-0196495 |
| Aug. 6, 1988 | [JP] | Japan | 63-196493 |
| Sep. 2, 1988 | [JP] | Japan | 63-129819 |

[51] Int. Cl.$^5$ .............. H01L 23/48; H01L 29/46; H01L 29/40; H01L 25/54
[52] U.S. Cl. .................. 357/65; 357/67; 357/71; 437/159; 437/200; 148/DIG. 19
[58] Field of Search ............. 437/189, 200; 148/DIG. 19; 357/65, 67, 71

[56] References Cited

U.S. PATENT DOCUMENTS

| 3,669,730 | 6/1972 | Lepselter | 117/107 |
| 4,141,022 | 2/1979 | Sigg et al. | 357/23 |
| 4,339,869 | 7/1982 | Reihl et al. | 29/576 B |
| 4,700,465 | 10/1987 | Sirkin | 437/20 |
| 4,713,358 | 12/1987 | Bulat et al. | 437/65 |
| 4,782,380 | 11/1988 | Shankar et al. | 357/71 |
| 4,792,892 | 12/1988 | Honma | 357/71 |
| 4,800,177 | 1/1989 | Nakame | 437/193 |
| 4,829,363 | 5/1989 | Thomas et al. | 357/71 |
| 4,890,141 | 12/1989 | Tang et al. | 357/23.3 |
| 4,894,693 | 1/1990 | Tigelar et al. | 357/23.6 |
| 4,897,368 | 1/1990 | Kobushi | 437/200 |

OTHER PUBLICATIONS

Takeo Maeda, Takeo Nakayama, Shohei Shima and Jun'ichi Matsunaga, "A Highly Reliable Interconnection for a $BF_2^+$-Implanted Junction Utilizing A TiN/Ti Barrier Metal System, IEEE Transactions on Electron Devices", vol. ED-34, No. 3, Mar. 1987, pp. 599–606.

Jim Stimmell, "Properties of dc Magnetron Reactively Sputtered TiN", J. Vac. Sci. Technol. B4(6), Nov./-Dec. 1986, pp. 1377–1382.

*Primary Examiner*—William D. Larkins
*Assistant Examiner*—Stephen D. Meier
*Attorney, Agent, or Firm*—Spensley Horn Jubas & Lubitz

[57] ABSTRACT

In a semiconductor device including a substrate of Si or polycrystalline silicon and an interlayer insulation film region, a region for interconnection with the substrate is composed of a refractory metal silicide layer, a refractory metal nitride layer, an Al or Al alloy layer, and possibly a further refractory metal nitride layer, while a region for interconnection on the interlayer insulation film on the substrate is composed of a refractory metal, or refractory metal oxide layer, a refractory metal nitride layer, an Al or Al alloy layer, and possibly a further refractory metal nitride layer, providing interconnections for integrated circuits. In the manufacture of this interconnection structure, rapid thermal annealing is performed at 600°–1000° C. on the refractory metal nitride layer of the region for interconnection with the substrate, followed by the formation of Al or Al alloy layer.

16 Claims, 4 Drawing Sheets

OHMIC CONTACT TO SILICON SUBSTRATE

BACKGROUND OF THE INVENTION

1. Field of the Invention

The present invention concerns a semiconductor device and method of manufacture and, particularly, it relates to an interconnection structure and fabrication method.

2. Description of the Prior Art

For interconnection structures in integrated circuits (IC), a dual layer structure comprising a barrier metal and an Al alloy has been used and, as a method of manufacturing such a structure, an Al alloy layer is formed to be contiguous with a barrier metal layer such as TiW or W, in which a region for connection with an Si substrate or polycrystalline silicon, silicide region (contact hole region) and a region on an insulation film are of identical structure.

In this case, the interconnection structure has to satisfy the requirements of preventing reaction between the Al alloy and Si, thereby avoiding spiking into the Si substrate and, further, improving the close bondability with the insulation film ($SiO_2$) as the underlying layer. However, since both improvement of the close bondability with $SiO_2$ and generation of spiking into the Si substrate are caused if the barrier metal is readily reactive with Si, improvement in the close bondability and the prevention of spiking cannot be achieved simultaneously and a compromise between those two objectives must be made. Further, the prior art structure has the disadvantage that it often occurs that the step-coverage of the interconnection deteriorates to interrupt the interconnection if the size of the contact hole is less than 1 $\mu$m.

SUMMARY OF THE INVENTION

An object of the present invention is to overcome such drawbacks in the prior art and provide a highly reliable semiconductor device with no Al spiking, having excellent close bondability and also having interconnections with satisfactory step-coverage.

The foregoing objects of the present invention are attained, in a semiconductor device, by the provision, in a region for connecting to an Si substrate or polycrystalline silicon, of silicide interconnections comprising refractory metal silicide, refractory metal nitride and Al or Al alloy and an interconnection region on an interlayer insulation film comprises refractory metal, refractory metal nitride and Al or Al alloy in the interconnection for integrated circuits.

The feature of the semiconductor device according to the present invention lies in that the interconnection structure for the region in connection with the Si substrate or polycrystalline silicon, silicide wiring is different from the interconnection structure on the interlayer insulation film.

Another object of the present invention is to provide a method of manufacturing the above-mentioned semiconductor device, which comprises a step of forming an aperture to an insulation film formed on a semiconductor substrate, a step of forming a refractory metal and refractory metal nitride, a step of applying a rapid thermal annealing at a temperature from 600° to 1000° C. and a step of forming Al or Al alloy on the refractory metal nitride.

The interconnection structure in the region for connection with the Si substrate or polycrystalline silicon, silicide interconnection has a three-layer structure comprising a refractory metal silicide, refractory metal nitride, an Al or Al alloy, or a four-layer structure comprising a refractory metal silicide, refractory metal nitride, an Al or Al alloy and a refractory metal nitride. The interconnection structure on the interlayer insulation film has a three-layer structure comprising a refractory metal or refractory metal oxide, a refractory metal nitride, Al or Al alloy or a four-layer structure comprising refractory or refractory metal oxide, refractory metal nitride, Al or Al alloy and refractory metal nitride.

BRIEF DESCRIPTION OF THE DRAWINGS

These and other objects, as well as advantageous features of the present invention will become more apparent from the following description of the preferred embodiments of the present invention in conjunction with the accompanying drawings, wherein.

DESCRIPTION OF THE PREFERRED EMBODIMENTS

The present invention will be described more specifically with reference to preferred embodiments.

FIGS. 1(a)–1(e) are cross-sectional views illustrating the sequence of manufacturing steps according to a preferred embodiment of the invention.

Figure 1A:
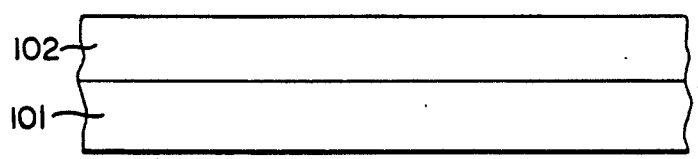
FIGS. 1(a)–1(e) are cross-sectional views illustrating successive manufacturing steps according to one embodiment of the present invention.

At first, as shown in FIG. 1(a), a silicon dioxide layer 102 prepared by reacting $SiH_4$ with $O_2$ or $N_2O$ into an interlayer insulation film by means of plasma or heat is formed on a semiconductor substrate 101 having transistors, etc., formed thereon, by means of gas phase growing to a thickness of about 0.3 to 0.6 $\mu$m. If flattening, etc., of layer 102 are required, it is desirable to form a glass coating, etc., by means of spin coating followed by heat treatment to improve flatness.

Figure 1B:
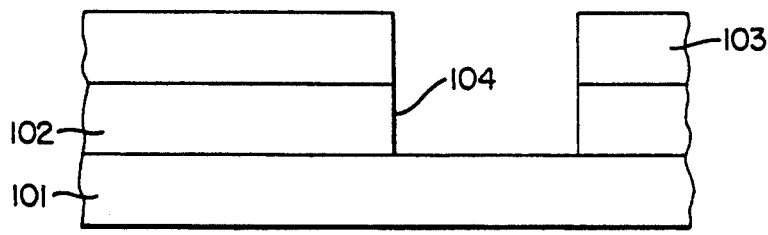

Then, as shown in FIG. 1(b) the silicon oxide layer 102 is patterned by dry etching using $CHF_3$, etc., to form a contact hole 104 using a photoresist layer 103 as a mask.

Figure 1C:
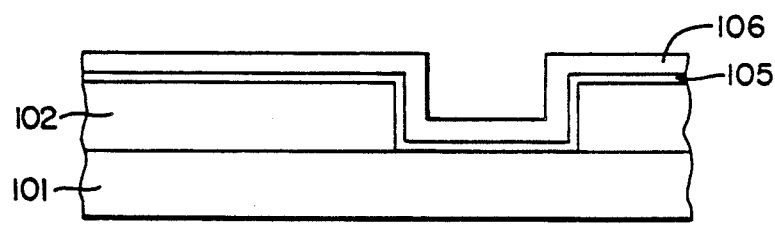

Then, as shown in FIG. 1(c), after removing photoresist layer 103 used as the mask, a Ti layer 105 is formed to 20 nm thickness by sputtering and, successively, a TiN layer 106 is formed to be contiguous with the Ti layer 105 on the patterned layer 102 to a thickness of 100 nm by means of reactive sputtering using a Ti target in a mixed Ar and $N_2$ gas atmosphere, or by means of sputtering using a TiN target.

Figure 1D:
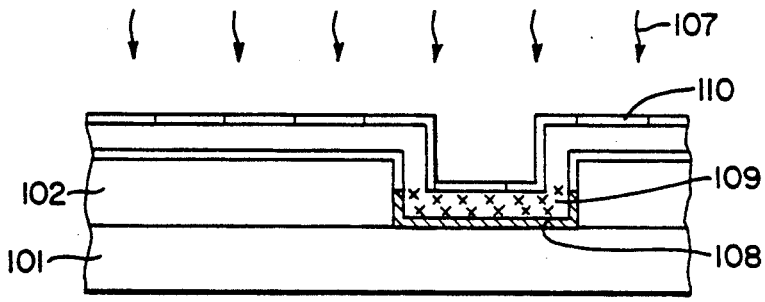

Then, as shown in FIG. 1(d), a dual layer structure comprising a Ti silicide layer 108 and a TiN layer 109 is formed for the contact region by performing a rapid thermal annealing treatment at a temperature from 600° to 800° C. in an $N_2$ atmosphere 107 having an $O_2$ concentration of less than 10 ppm. Layer 108, which is represented by the hatched region of FIG. 1(d), should be composed substantially entirely of Tl silicide, for example $TiSi$ and/or $TiSi_2$. Further, Si is diffused into the grain boundary in the TiN layer 109 for the contact region to form the TiN layer 109 containing Si. Further, O atoms intrude slightly to the surface 110 for the TiN layer 109 due to the extremely low $O_2$ concentration (lower than 10 ppm). This rapid thermal annealing treatment may be performed for 5 to 60 seconds, a preferred duration being approximately 30 seconds.

Figure 1E:
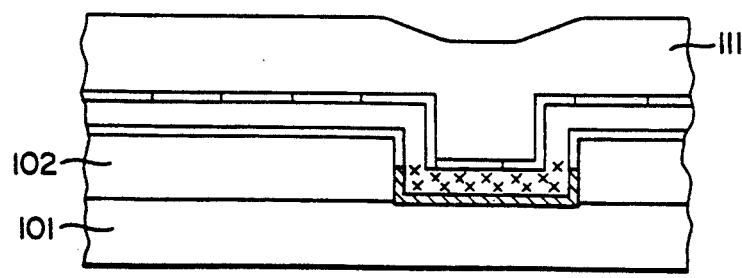

Then, as shown in FIG. 1(e), an Al-0.3% Cu layer 111 is formed to a thickness of 0.8 μm by means of heat sputtering or bias sputtering at a temperature of higher than 250° C. In this step, Si atoms contained in the TiN layer 109 for the contact region easily intrude into the Al-0.3% Cu layer 111 to lower the melting point of the Al alloy and, at the same time, improve the wettability of the Al alloy. Further, since oxygen in the TiN layer 109 and the surface 110 thereof also improves the Al wettability, Al atoms can easily intrude into the contact region to provide satisfactory coverage even for a hole 104 of submicron size with an aspect ratio of not less than 1. Furthermore, the thus formed Si-containing TiN layer 109 can prevent reactions between Si and the Al layer.

Figure 5A:
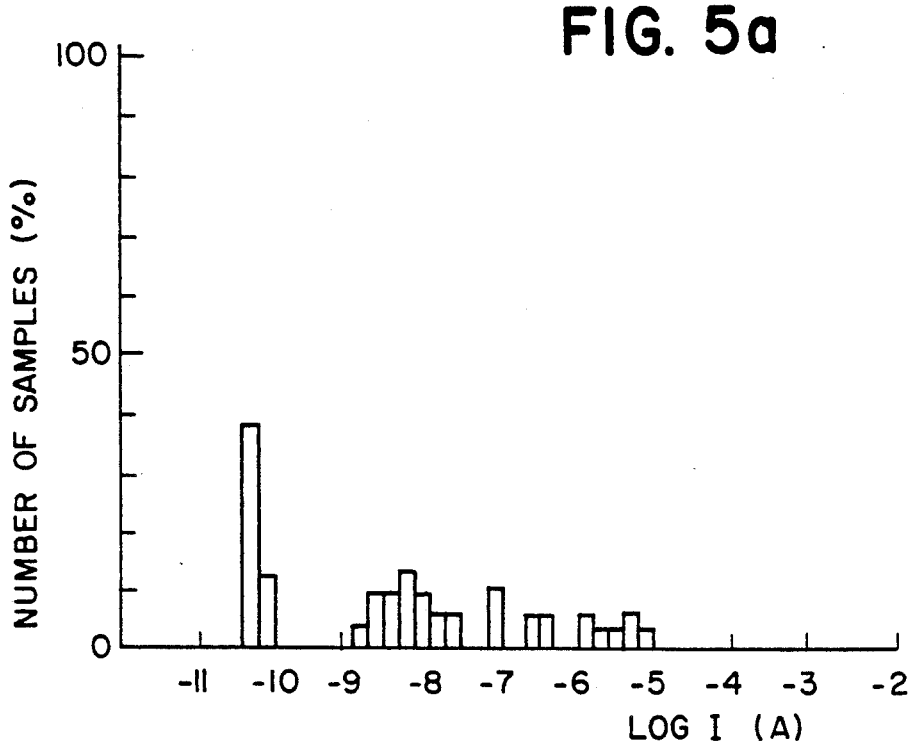
FIGS. 5(a) and 5(b) are graphs showing the junction leak current in a semiconductor device manufactured according to the present invention and one manufactured with no rapid thermal annealing.
Figure 5B:
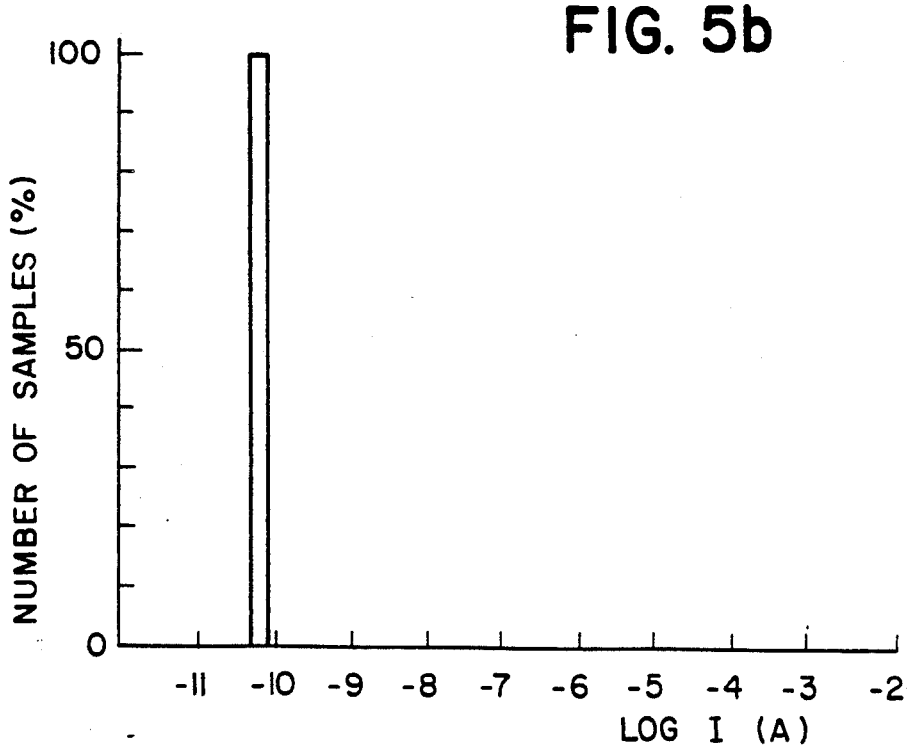

FIGS. 5 show the result of measurements of the junction current leak, FIG. 5(a) being with respect to samples not subjected to rapid thermal annealing and FIG. 5(b) representing samples which were subject to rapid thermal annealing. For measurements, a voltage of 5 (V) with inverse polarity is applied to an $N^{30}$ —P— junction and the current was measured. The rapid annealing treatment for the samples of FIG. 5(b) is conducted at 700° C. for 30 seconds and thermal annealing at 450° C. for 30 minutes is conducted three times after the formation of the interconnections for the samples of both FIGS. 5(a) and 5(b).

As apparent from FIGS. 5(a) and 5(b), defects of not less than 50% are observed for the samples not subjected to rapid thermal annealing, whereas no defects are observed in the samples fabricated according to the present invention. This is attributable to the prevention of the Al atoms from intruding into the Si substrate since the TiN layer contains the Si atoms and the O atoms in the grain boundary.

Figure 6:
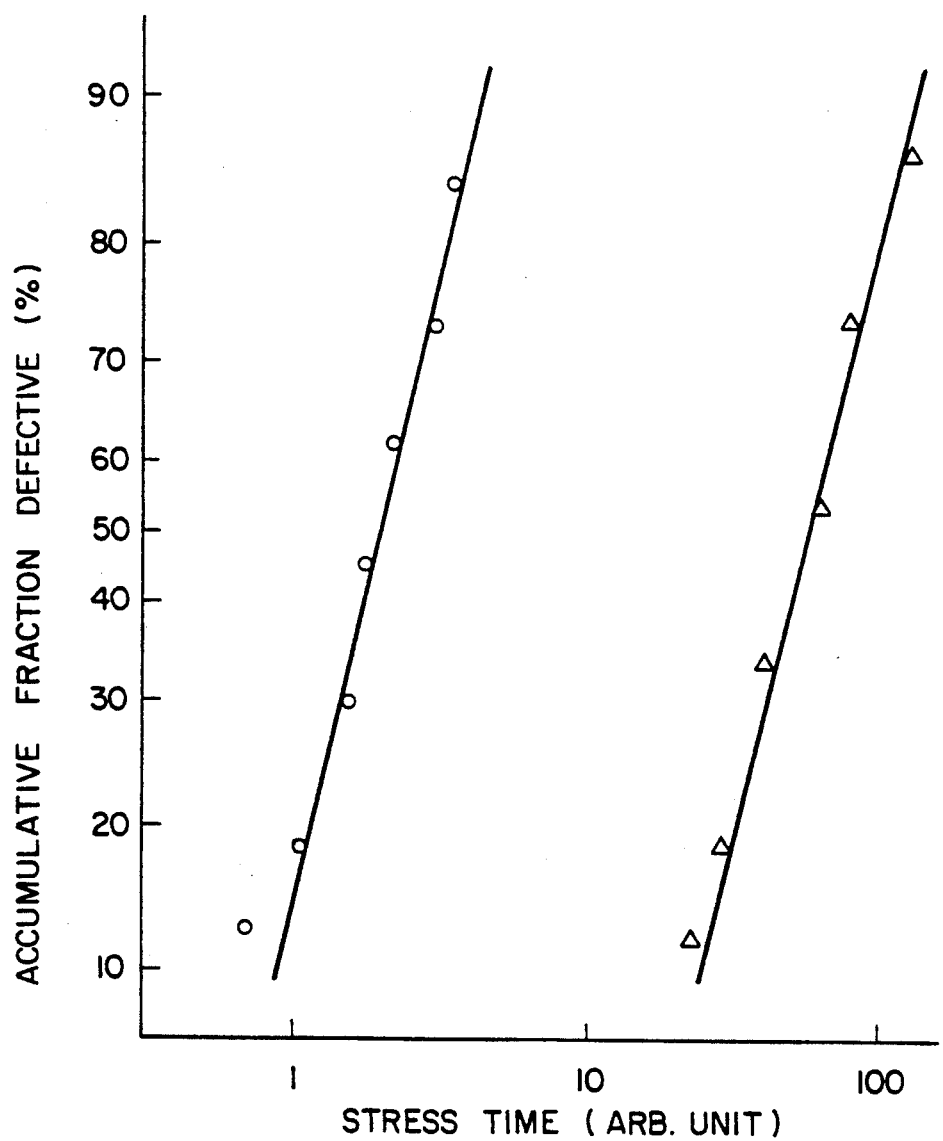
FIGS. 6 are views illustrating the result of measurement for the electromigration of interconnections in a semiconductor device manufactured by the present invention and one with no rapid thermal annealing, respectively.

In addition, in the manufacturing method according to the present invention, interconnection breaks due to electromigration are also suppressed to improve reliability. FIG. 6 shows this result, in which the curve based on plot points indicated by symbols: "o" represents interconnections not subjected to rapid thermal annealing and the curve based on points indicated by symbols; "Δ" represents interconnections formed according to one embodiment of the present invention, each curve being the result of measurements for electromigration. As can be seen from FIG. 6, the connections with "Δ" according to the present invention have an increased working life about one order of magnitude higher than that of the case where rapid thermal annealing was not performed.

Figure 2:
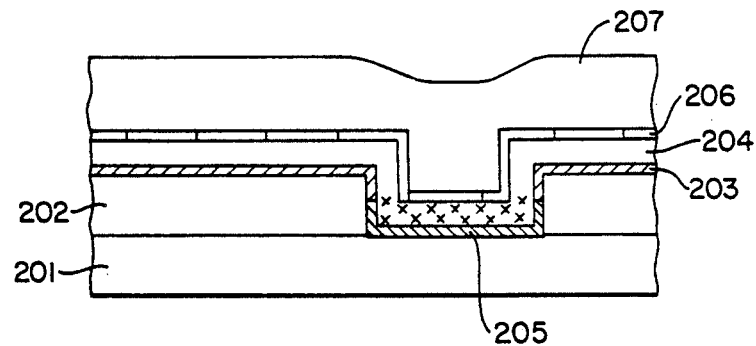
FIGS. 2–4 are, respectively, cross-sectional views illustrating another embodiment of the present invention.

According to another embodiment, shown in FIG. 2, where rapid thermal annealing is performed at 800°-1000° C., Ti on the $SiO_2$ layer 202 formed on substrate 201 reacts with O of the $SiO_2$ to form a TiO layer 203 thereby further improving the close bondability between the interconnection and the $SiO_2$ layer 202. This embodiment further includes a TiN layer 204 having a surface 206 and an Al-Cu layer 207. The rapid thermal annealing treatment may be carried out for 5 to 60 seconds, a preferred duration being 30 seconds, in an $N_2$ atmosphere containing no more than 10 ppm $O_2$.

Figure 3:
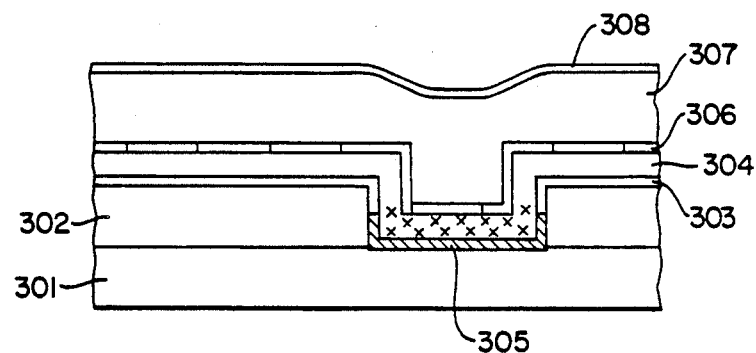
Figure 4:
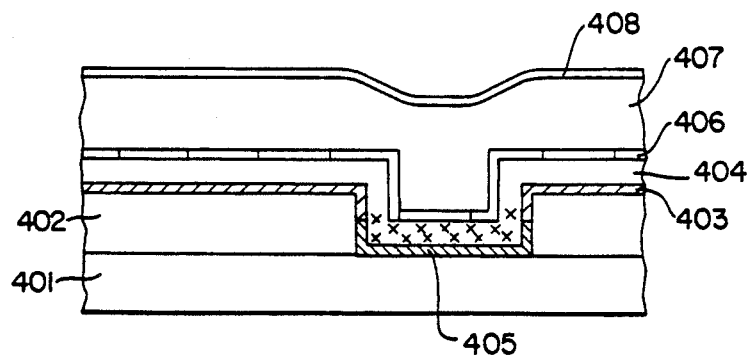

Further, as shown in FIGS. 3 and 4, when a TiN layer 308, 408 is formed to a thickness of 30-50 nm on an Al-0.3% Cu layer 307, 407, this forms a reflection preventive layer in the photoetching step upon patterning the interconnection to prevent halation and obtain interconnection material just along a desired pattern.

Although Ti has been used as the material subjected to rapid thermal annealing in this embodiment, W, Mo, Ta, or equivalents thereof may also be used. When W, Mo, Ta, etc., is employed in place of Ti, the layer thickness and annealing parameters may be the same as those described above. Similarly, although Al-0.3% Cu has been used as the Al alloy, other Al-Cu alloys, Al-Ti alloys, Al-Si alloys, etc., may also be applicable.

As has been described above, the present invention can provide a highly reliable semiconductor device which can prevent the reaction between Al alloy and Si and interconnection breaks due to electromigration, and which offers excellent close bondability between the interconnection and the interlayer insulation film, as well as step coverage of the Al alloy.

What is claimed is:

1. In a semiconductor device composed of a silicon-containing substrate and an insulation film disposed on the substrate and having at least one opening at which the substrate is exposed, the improvement comprising an interconnection structure composed of: a first layer contacting said insulation layer and said substrate within the opening; a second layer of a refractory metal nitride disposed on said first layer; and a conductive body of aluminum or an aluminum alloy disposed on said second layer; wherein said interconnection structure is constituted by a first region where said first layer contacts said substrate and a second region where said first layer contacts said insulation film, said first layer is composed of a refractory metal silicide in said first region and a refractory metal in said second region and said second layer contains oxygen atoms across the entirety of said first and second regions.

2. A semiconductor device as defined in claim 1 wherein said second layer contains Si atoms in said first region.

3. A semiconductor device as defined in claim 1 wherein said second layer contains Si atoms in said first region.

4. A semiconductor device as defined in claim 1 wherein said interconnection structure further comprises a third layer of a refractory metal nitride disposed on said conductive body.

5. A semiconductor device as defined in claim 4 wherein said second layer contains Si atoms in said first region.

6. A semiconductor device as defined in claim 1 wherein said interconnection structure further comprises a third layer of a refractory metal nitride disposed on said conductive body.

7. A semiconductor device as defined in claim 6 wherein said second layer contains Si atoms in said first region.

8. A semiconductor device as defined in claim 1 where said opening has a diameter not greater than 1μ.

9. In a semiconductor device composed of a silicon-containing substrate and an insulation film disposed on the substrate and having at least one opening at which the substrate is exposed, the improvement comprising an interconnection structure composed of: a first layer contacting said insulation layer and said substrate within the opening; a second layer of a refractory metal nitride disposed on said first layer; and a conductive body of aluminum or an aluminum alloy disposed on said second layer; wherein said interconnection structure is constituted by a first region where said first layer contacts said substrate and a second region where said first layer contacts said insulation film, said first layer is composed of a refractory metal silicide in said first region and a refractory metal oxide in said second region and said second layer contains oxygen atoms across the entirety of said first and second regions.

10. A semiconductor device as defined in claim 9 wherein said second layer contains Si atoms in said first region.

11. A semiconductor device as defined in claim 9 wherein said second layer contains Si atoms in said first region.

12. A semiconductor device as defined in claim 9 wherein said interconnection structure further comprises a third layer of a refractory metal nitride disposed on said conductive body.

13. A semiconductor device as defined in claim 12 wherein said second layer contains Si atoms in said first region.

14. A semiconductor device as defined in claim 9 wherein said interconnection structure further comprises a third layer of a refractory metal nitride disposed on said conductive body.

15. A semiconductor device as defined in claim 14 wherein said second layer contains Si atoms in said first region.

16. A semiconductor device as defined in claim 9 where said opening has a diameter not greater than $1\mu$.

* * * * *